(12) United States Patent
Lee et al.

(10) Patent No.: US 10,686,150 B2
(45) Date of Patent: Jun. 16, 2020

(54) ORGANIC LIGHT EMITTING DEVICE

(71) Applicant: LG CHEM, LTD., Seoul (KR)

(72) Inventors: Sangbin Lee, Daejeon (KR); Jungoh Huh, Daejeon (KR)

(73) Assignee: LG CHEM, LTD., Seoul (KR)

(*) Notice: Subject to any disclaimer, the term of this patent is extended or adjusted under 35 U.S.C. 154(b) by 179 days.

(21) Appl. No.: 15/550,996

(22) PCT Filed: Dec. 23, 2015

(86) PCT No.: PCT/KR2015/014214
§ 371 (c)(1),
(2) Date: Aug. 14, 2017

(87) PCT Pub. No.: WO2016/148382
PCT Pub. Date: Sep. 22, 2016

(65) Prior Publication Data
US 2018/0033989 A1    Feb. 1, 2018

(30) Foreign Application Priority Data
Mar. 16, 2015 (KR) .................. 10-2015-0036097

(51) Int. Cl.
*H01L 51/00* (2006.01)
*H01L 51/50* (2006.01)
(Continued)

(52) U.S. Cl.
CPC ........ *H01L 51/5004* (2013.01); *C09K 11/025* (2013.01); *C09K 11/06* (2013.01);
(Continued)

(58) Field of Classification Search
CPC ............ H01L 51/5004; H01L 51/5076; H01L 51/5092; H01L 51/0094; H01L 51/006; H01L 51/0061; H01L 51/00; H01L 51/50; H01L 51/504; H01L 51/0079; H01L 51/0052; H01L 51/5072; H01L 51/0058;
(Continued)

(56) References Cited

U.S. PATENT DOCUMENTS 6,303,238 B1 * 10/2001 Thompson ........... C07D 487/22
252/301.16
7,629,062 B2   12/2009 Moriyama et al.
(Continued)

FOREIGN PATENT DOCUMENTS

CN    101499517 A    8/2009
CN    102916134 A    2/2013
(Continued)

OTHER PUBLICATIONS

Sung Hoon Choi, et al. "Improved Efficiency and Lifetime of Organic Light-Emitting Diode with Lithium-Quinolate-doped Electron transport layer", Jpn. J. Appl. Phys., 48, 062101 (2009).

*Primary Examiner* — Alexander C Kollias
(74) *Attorney, Agent, or Firm* — Dentons US LLP

(57) ABSTRACT

The present specification relates to an organic light emitting device including: a cathode; an anode; a light emitting layer provided between the cathode and the anode; and one or more organic material layers provided between the cathode and the light emitting layer.

11 Claims, 1 Drawing Sheet

(51) Int. Cl.
*C09K 11/06* (2006.01)
*C09K 11/02* (2006.01)

(52) U.S. Cl.
CPC ............ *H01L 51/00* (2013.01); *H01L 51/006* (2013.01); *H01L 51/0061* (2013.01); *H01L 51/0094* (2013.01); *H01L 51/50* (2013.01); *H01L 51/5076* (2013.01); *H01L 51/5092* (2013.01); *C09K 2211/1007* (2013.01); *C09K 2211/1011* (2013.01); *C09K 2211/1014* (2013.01); *C09K 2211/185* (2013.01); *H01L 51/0052* (2013.01); *H01L 51/0058* (2013.01); *H01L 51/0067* (2013.01); *H01L 51/0072* (2013.01); *H01L 51/0077* (2013.01); *H01L 51/0079* (2013.01); *H01L 51/504* (2013.01); *H01L 51/5036* (2013.01); *H01L 51/5072* (2013.01); *H01L 51/5096* (2013.01); *H01L 2251/5376* (2013.01); *H01L 2251/552* (2013.01)

(58) Field of Classification Search
CPC ............ H01L 51/0077; H01L 51/5036; H01L 51/0072; H01L 2251/552; H01L 2251/5376; H01L 51/5096; H01L 51/0067
See application file for complete search history.

(56) References Cited

U.S. PATENT DOCUMENTS

| | | | |
|---|---|---|---|
| 7,999,459 B2 | 8/2011 | Chun et al. | |
| 8,673,460 B2 | 3/2014 | Kim et al. | |
| 8,703,301 B2 | 4/2014 | Kwon et al. | |
| 8,999,524 B2 | 4/2015 | Kim et al. | |
| 2004/0262576 A1 | 12/2004 | Thompson et al. | |
| 2007/0001587 A1* | 1/2007 | Hatwar | H01L 51/5036 313/504 |
| 2007/0020483 A1 | 1/2007 | Park et al. | |
| 2007/0252126 A1 | 11/2007 | Kawakami et al. | |
| 2009/0146552 A1* | 6/2009 | Spindler | H01L 51/5036 313/504 |
| 2011/0108821 A1 | 5/2011 | Kaiser et al. | |
| 2013/0181196 A1 | 7/2013 | Lee et al. | |
| 2014/0048792 A1* | 2/2014 | Chun | H01L 51/0072 257/40 |
| 2014/0103325 A1 | 4/2014 | Shin et al. | |
| 2014/0138659 A1 | 5/2014 | Shin et al. | |
| 2014/0332790 A1 | 11/2014 | Fadhel et al. | |

FOREIGN PATENT DOCUMENTS

| | | |
|---|---|---|
| CN | 102947415 A | 2/2013 |
| CN | 103548172 A | 1/2014 |
| CN | 103597053 A | 2/2014 |
| CN | 103608429 A | 2/2014 |
| CN | 103764789 A | 4/2014 |
| CN | 104247070 A | 12/2014 |
| EP | 2582768 A1 | 12/2011 |
| EP | 2719743 A2 | 4/2014 |
| JP | 2007-036175 A | 2/2007 |
| JP | 2010-027761 A | 2/2010 |
| JP | 2011-529614 A | 12/2011 |
| JP | 2012-204037 A | 10/2012 |
| JP | 2014-523876 A | 9/2014 |
| JP | 2014-523877 A | 9/2014 |
| KR | 1020050005527 A | 1/2005 |
| KR | 1020090082778 A | 7/2009 |
| KR | 1020090129756 A | 12/2009 |
| KR | 1020110027635 A | 3/2011 |
| KR | 1020110121271 A | 11/2011 |
| KR | 1020130037186 A | 4/2013 |
| WO | 2011157779 A1 | 12/2011 |
| WO | 2013051875 A2 | 11/2013 |

* cited by examiner

[Figure 1]
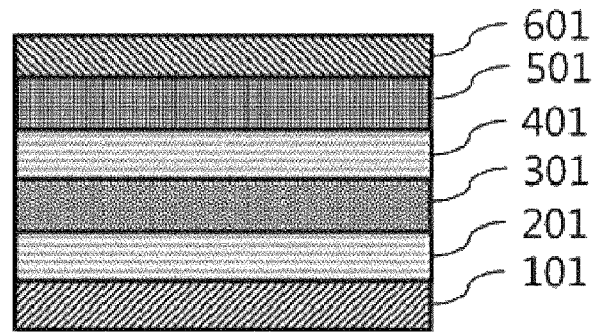
[Figure 2]
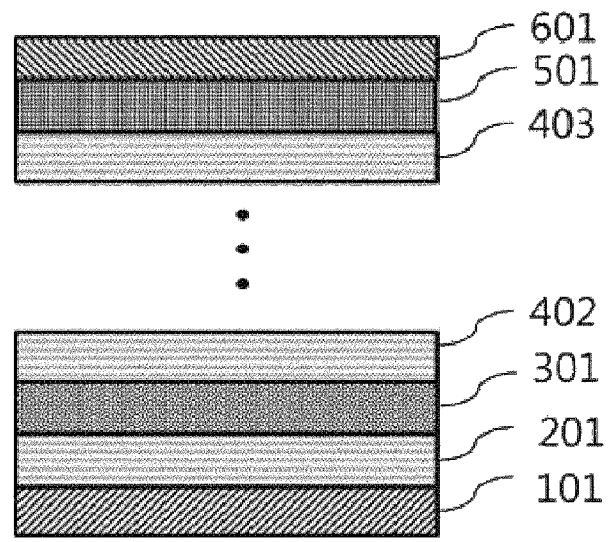
[Figure 3]
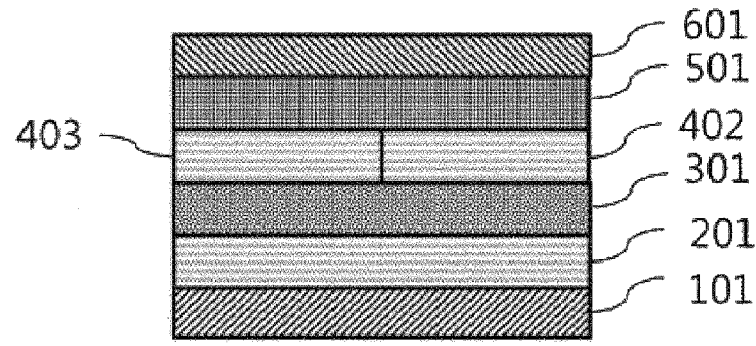

ORGANIC LIGHT EMITTING DEVICE

This application is a National Stage Application of International Application No. PCT/KR2015/014214, filed Dec. 23, 2015, and claims the benefit of Korean Patent Application No. 10-2015-0036097, filed Mar. 16, 2015, contents of which are incorporated herein by reference in their entirety for all purposes as if fully set forth below.

TECHNICAL FIELD

The present specification claims priority to and the benefit of Korean Patent Application No. 10-2015-0036097 filed in the Korean Intellectual Property Office on Mar. 16, 2015, the entire contents of which are incorporated herein by reference.

The present specification relates to an organic light emitting device.

BACKGROUND ART

An organic light emission phenomenon is one of the examples of converting current into visible rays through an internal process of a specific organic molecule. The principle of the organic light emission phenomenon is as follows.

When an organic material layer is disposed between an anode and a cathode, if voltage is applied between the two electrodes, electrons and holes are injected into the organic material layer from the cathode and the anode, respectively. The electrons and the holes which are injected into the organic material layer are recombined to form an exciton, and the exciton falls down again to the ground state to emit light. An organic light emitting device using this principle may be composed of a cathode, an anode, and an organic material layer disposed therebetween, for example, an organic material layer including a hole injection layer, a hole transporting layer, a light emitting layer, and an electron transporting layer.

The materials used in the organic light emitting device are mostly pure organic materials or complex compounds in which organic materials and metals form a complex compound, and may be classified into a hole injection material, a hole transporting material, a light emitting material, an electron transporting material, an electron injection material, and the like according to the use thereof. Here, an organic material having a p-type property, that is, an organic material, which is easily oxidized and electrochemically stable when the material is oxidized, is usually used as the hole injection material or the hole transporting material. Meanwhile, an organic material having an n-type property, that is, an organic material, which is easily reduced and electrochemically stable when the material is reduced, is usually used as the electron injection material or the electron transporting material. As the light emitting layer material, a material having both p-type and n-type properties, that is, a material, which is stable during both the oxidation and reduction states, is preferred, and when an exciton is formed, a material having high light emitting efficiency for converting the exciton into light is preferred.

There is a need in the art for developing an organic light emitting device having high efficiency.

CITATION LIST

Patent Document

Official Gazette of Korean Patent Application Laid-Open No. 2011-0027635

DETAILED DESCRIPTION OF THE INVENTION

Technical Problem

An object of the present specification is to provide an organic light emitting device having excellent light emission and service life characteristics.

Technical Solution

An exemplary embodiment of the present specification provides an organic light emitting device including:
a cathode; an anode; a light emitting layer provided between the cathode and the anode; and
one or more organic material layers provided between the cathode and the light emitting layer,
in which one or more layers of the organic material layers provided between the cathode and the light emitting layer include: a compound including a heteroatom; and an alkali metal complex or an alkaline earth metal complex, and
at least one of the heteroatoms of the compound including the heteroatom and the alkali metal complex or the alkaline earth metal complex are docked to each other,
the compound including the heteroatom before the docking has a dipole moment of less than 6 debye, and
the compound including the heteroatom after the docking has a dipole moment of 6 debye to 13 debye.

Advantageous Effects

An organic light emitting device according to an exemplary embodiment of the present specification has excellent electron and hole mobility at low driving voltage, and thus provides high light emitting efficiency.

Further, the organic light emitting device according to an exemplary embodiment of the present specification has excellent durability because electrons at each layer thereof move smoothly, and thus has excellent service life characteristics.

BRIEF DESCRIPTION OF DRAWINGS

FIG. 1 is a view illustrating an organic light emitting device according to an exemplary embodiment of the present specification.

FIG. 2 is a view illustrating an organic light emitting device according to an exemplary embodiment of the present specification.

FIG. 3 is a view illustrating an organic light emitting device according to an exemplary embodiment of the present specification.

EXPLANATION OF REFERENCE NUMERALS AND SYMBOLS

101: Substrate
201: Anode
301: Hole transporting layer
401: Light emitting layer
402: Second light emitting layer
403: First light emitting layer
501: Electron transporting layer
601: Cathode

BEST MODE

Hereinafter, the present specification will be described in more detail.

When one member is disposed "on" another member in the present specification, this includes not only a case where the one member is brought into contact with another member, but also a case where still another member is present between the two members.

When one part "includes" one constituent element in the present specification, unless otherwise specifically described, this does not mean that another constituent element is excluded, but means that another constituent element may be further included.

An exemplary embodiment of the present specification provides an organic light emitting device including: a cathode; an anode; a light emitting layer provided between the cathode and the anode; and one or more organic material layers provided between the cathode and the light emitting layer, in which one or more layers of the organic material layers provided between the cathode and the light emitting layer include: a compound including a heteroatom; and an alkali metal complex or an alkaline earth metal complex, and at least one of the heteroatoms of the compound including the heteroatom and the alkali metal complex or the alkaline earth metal complex are docked to each other, the compound including the heteroatom before the docking has a dipole moment of less than 6 debye, and the compound including the heteroatom after the docking has a dipole moment of 6 debye to 13 debye.

As in an exemplary embodiment of the present specification, when the dipole moment of the compound including the heteroatom before the heteroatom and the alkali metal complex or the alkaline earth metal complex are docked to each other is less than 6 debye, the stability of the compound is better than the case where the compound has a dipole moment of 6 debye or more. However, when the compound having a dipole moment of less than 6 debye is used for an organic material layer, the organic light emitting device may be disadvantageous in terms of the efficiency of the diode. Accordingly, the present invention enhances the efficiency of the diode by adjusting the dipole moment to 6 debye to 13 debye through the docking of the heteroatom to the alkali metal complex or the alkaline earth metal complex.

Accordingly, as in an exemplary embodiment of the present specification, when the dipole moment is in the range before and after the heteroatom and the alkali metal complex or the alkaline earth metal complex are docked to each other, an organic light emitting device having low driving voltage, high efficiency, and a long service life may be expected.

The term "docking" in the present specification may mean that a heteroatom of a compound including the heteroatom and an alkali metal complex or an alkaline earth metal complex combine with each other by means of London dispersion forces or dipole-induced dipole forces. Specifically, a heteroatom of the compound including the heteroatom may be docked to an alkali metal or an alkaline earth metal of the alkali metal complex or the alkaline earth metal complex.

In the present specification, the term "complex" in the alkali metal complex and the alkaline earth metal complex may mean that an alkali metal or an alkaline earth metal and atoms or molecules combine with each other to form one molecule.

The dipole moment in the present specification is a physical quantity which indicates the degree of polarity, and may be calculated by the following Equation 1.

$$p(r) = \int_V \rho(r_0)(r_0 - r)d^3r_0 \qquad \text{[Equation 1]}$$

$\rho(r_0)$: molecular density $V$: volume $r$: the point of observation $d^3r_0$: an elementary volume The value of the dipole moment may be obtained by calculating the molecular density in Equation 1. For example, the molecular density may be obtained by using a method called Hirshfeld Charge Analysis to obtain a charge and a dipole for each atom and performing the calculation according to the following equations, and the dipole moment may be obtained by substituting the Equation 1 with the calculation result.

Weight Function $$W_\alpha(r) = \rho_\alpha(r - R_\alpha)\left[\sum_\beta \rho_\beta(r - R_\beta)\right]^{-1}$$

$\rho_\alpha(r - R_\alpha)$: spherically average ground-state atomic density $\sum_\beta \rho_\beta(r - R_\beta)$: promolecule density Deformation Density $$\rho_d(r) = \rho(r) - \sum_\alpha \rho_\alpha(r - R_\alpha)$$

$\rho(r)$: molecular density $\rho_\alpha(r - R_\alpha)$: density of the free atom $\alpha$ located at coordinates $R_\alpha$ Atomic Charge $$q(\alpha) = -\int \rho_d(r) W_\alpha(r) d^3r$$

$W_\alpha(r)$: weight function

In an exemplary embodiment of the present specification, the organic material layer including: a compound including a heteroatom; and an alkali metal complex or an alkaline earth metal complex is one or two or more layers selected from the group consisting of an electron injection layer, an electron transporting layer, and a hole blocking layer.

In an exemplary embodiment of the present specification, the organic material layer including: a compound including a heteroatom; and an alkali metal complex or an alkaline earth metal complex is an electron transporting layer.

In another exemplary embodiment, the organic material layer including: a compound including a heteroatom; and an alkali metal complex or an alkaline earth metal complex is a hole blocking layer.

The organic light emitting device having the aforementioned dipole moment value range may provide low driving voltage and high light emitting efficiency because the capability of injecting and transporting electrons introduced from the cathode is improved. Further, the arrangement of the molecules in the organic light emitting device is excellent, thereby providing a dense and compact film. Accordingly, the organic light emitting device including an electron transporting material is excellent in stability, and thus, it is possible to provide an organic light emitting device having a long service life.

In an exemplary embodiment of the present specification, the difference between the dipole moment value of the compound after the docking and the dipole moment value of the compound including a heteroatom before the docking is 3 debye or more.

In an exemplary embodiment of the present specification, the difference between the dipole moment value of the compound including a heteroatom after the docking and the dipole moment value of the compound including a heteroatom before the docking is 3 debye or more and 8 debye or less.

As in an exemplary embodiment of the present specification, it is preferred that the organic material layer between the cathode and the light emitting layer includes a material which smoothly transports electrons for the low driving voltage of the organic light emitting device. In order to smoothly transport electrons as described above, the dipole moment value of the organic material layer is preferably 6 debye to 13 debye, but when the dipole moment value of the compound itself is in the range of 6 debye to 13 debye, the instability of the compound may be problematic.

As in an exemplary embodiment of the present specification, it is possible to adjust the dipole moment value to 6 debye to 13 debye and, simultaneously, to form a highly stable organic material layer, by varying the dipole moment values before and after the heteroatom is docked to the alkali metal complex or the alkaline earth metal complex. Accordingly, the organic light emitting device according to an exemplary embodiment of the present specification may provide high light emitting efficiency, and simultaneously, have a positive influence on the service life of the diode.

Specifically, it can be considered that the higher the difference between the dipole moment value of the compound including a heteroatom before the docking and the dipole moment value of the compound including a heteroatom after the docking is, the more stable the docking is, and the difference is preferably 3 debye or more.

In an exemplary embodiment of the present specification, the organic material layer including: a compound including a heteroatom; and an alkali metal complex or an alkaline earth metal complex includes the compound including a heteroatom and the alkali metal complex or the alkaline earth metal complex at a weight ratio of 1:9 to 9:1. The weight ratio is preferably 3:7 to 7:3, and more preferably 4:6 to 6:4.

In an exemplary embodiment of the present specification, a heteroatom of the compound including the heteroatom includes a trivalent atom.

In an exemplary embodiment of the present specification, the compound including the heteroatom is a compound including one or two or more N atoms.

The heteroatom as described above includes an unshared electron pair, and the unshared electron pair may serve as a docking site which may facilitate the docking of the alkali metal complex or the alkaline earth metal complex, and electrons may be more easily transported through the docking.

In an exemplary embodiment of the present specification, the compound including the heteroatom may be an aromatic hetero ring. In the case as described above, electrons may easily move because a conjugated structure is included in the structure of the compound.

The conjugated structure in the present specification means a structure in which two or more double bonds or triple bonds are present while including each one single bond therebetween, and may mean a structure in which a resonance structure may be formed.

In an exemplary embodiment of the present specification, the compound including the heteroatom includes any one of the following structures.

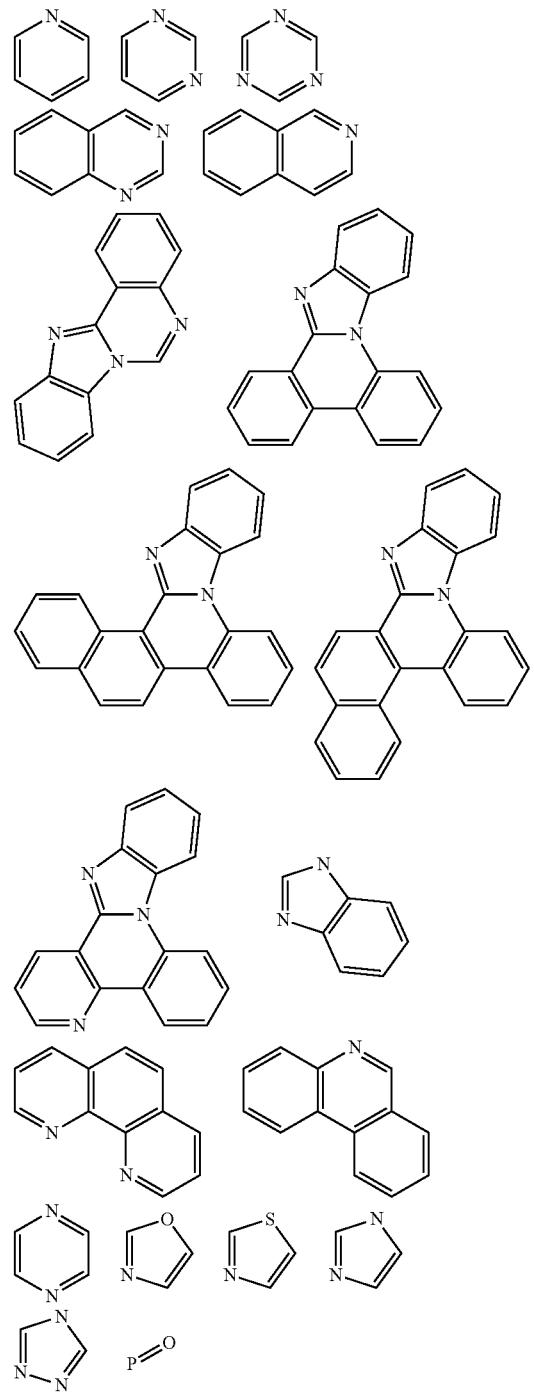

The structure is unsubstituted or substituted with one or two or more substituent groups selected from the group consisting of deuterium; a substituted or unsubstituted alkyl group; a substituted or unsubstituted aryl group; and a substituted or unsubstituted heterocyclic group, or adjacent substituent groups may combine with each other to form a substituted or unsubstituted ring.

In an exemplary embodiment of the present specification, the alkali metal complex or the alkaline earth metal complex is represented by the following Chemical Formula 1.

[Chemical Formula 1]

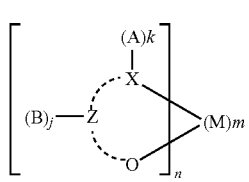

In Chemical Formula 1,

Z and a dashed arc represent two or three atoms and bonds essentially required to complete a 5- or 6-membered ring together with M, A's each represent hydrogen or a substituent, B's each are an independently selected substituent on a Z atom, or two or more substituents combine with each other to form a substituted or unsubstituted ring, j is 0 to 3, k is 1 or 2, M is an alkali metal or an alkaline earth metal, X is N or O, and m and n are an integer independently selected so as to provide a neutral charge on a complex.

Examples of the substituent groups will be described below, but the present specification is not limited thereto.

The term "substitution" means that a hydrogen atom bonded to a carbon atom of a compound is changed into another substituent group, and a position to be substituted is not limited as long as the position is a position at which the hydrogen atom is substituted, that is, a position at which the substituent group may be substituted, and when two or more are substituted, the two or more substituent groups may be the same as or different from each other.

In the present specification, the term "substituted or unsubstituted" means that a group is substituted with one or two or more substituent groups selected from the group consisting of deuterium; a halogen group; a nitrile group; a nitro group; an imide group; an amide group; a hydroxy group; a substituted or unsubstituted alkyl group; a substituted or unsubstituted cycloalkyl group; a substituted or unsubstituted alkoxy group; a substituted or unsubstituted alkenyl group; a substituted or unsubstituted amine group; a substituted or unsubstituted aryl group; and a substituted or unsubstituted heterocyclic group or is substituted with a substituent group to which two or more substituent groups are linked among the substituent groups exemplified above, or has no substituent group. For example, "the substituent group to which two or more substituent groups are linked" may be a biphenyl group. That is, the biphenyl group may also be an aryl group, and may be interpreted as a substituent group to which two phenyl groups are linked.

With respect to the substituent in the present specification, one or two or more may be selected from the group consisting of deuterium; a halogen group; a nitrile group; a nitro group; an imide group; an amide group; a hydroxy group; a substituted or unsubstituted alkyl group; a substituted or unsubstituted cycloalkyl group; a substituted or unsubstituted alkoxy group; a substituted or unsubstituted alkenyl group; a substituted or unsubstituted amine group; a substituted or unsubstituted aryl group; and a substituted or unsubstituted heterocyclic group.

In the present specification, the alkyl group may be straight-chained or branched, and the number of carbon atoms thereof is not particularly limited, but is preferably 1 to 50. Specific examples thereof include a methyl group, an ethyl group, a propyl group, an isopropyl group, a butyl group, a t-butyl group, a pentyl group, a hexyl group, a heptyl group, and the like, but are not limited thereto.

In the present specification, the alkenyl group may be straight-chained or branched, and the number of carbon atoms thereof is not particularly limited, but is preferably 2 to 40. Specific examples thereof include vinyl, 1-propenyl, isopropenyl, 1-butenyl, 2-butenyl, 3-butenyl, 1-pentenyl, 2-pentenyl, 3-pentenyl, 3-methyl-1-butenyl, 1,3-butadienyl, allyl, 1-phenylvinyl-1-yl, 2-phenylvinyl-1-yl, 2,2-diphenylvinyl-1-yl, 2-phenyl-2-(naphthyl-1-yl)vinyl-1-yl, 2,2-bis(diphenyl-1-yl)vinyl-1-yl, a stilbenyl group, a styrenyl group, and the like, but are not limited thereto.

In the present specification, the cycloalkyl group is not limited thereto, but has preferably 3 to 60 carbon atoms, and examples thereof include a cyclopentyl group, a cyclohexyl group, and the like, but are not limited thereto.

In the present specification, the amine group may be selected from the group consisting of —$NH_2$; an alkylamine group; an aralkylamine group; an arylamine group; and a heteroarylamine group, and the number of carbon atoms thereof is not particularly limited, but is preferably 1 to 30. Specific examples of the amine group include a methylamine group, a dimethylamine group, an ethylamine group, a diethylamine group, a phenylamine group, a naphthylamine group, a biphenylamine group, an anthracenylamine group, a 9-methyl-anthracenylamine group, a diphenylamine group, a phenylnaphthylamine group, a ditolylamine group, a phenyltolylamine group, a triphenylamine group, and the like, but are not limited thereto.

When the aryl group is a monocyclic aryl group, the number of carbon atoms thereof is not particularly limited, but is preferably 6 to 25. Specific examples of the monocyclic aryl group include a phenyl group, a biphenyl group, a terphenyl group, and the like, but are not limited thereto.

When the aryl group is a polycyclic aryl group, the number of carbon atoms thereof is not particularly limited, but is preferably 10 to 24. Specific examples of the polycyclic aryl group include a naphthyl group, a triphenylenyl group, an anthracenyl group, a phenanthryl group, a pyrenyl group, a perylenyl group, a chrysenyl group, a fluorenyl group, and the like, but are not limited thereto.

In the present specification, the fluorenyl group may be substituted, and adjacent substituent groups may combine with each other to form a ring.

When the fluorenyl group is substituted, the substituent may be

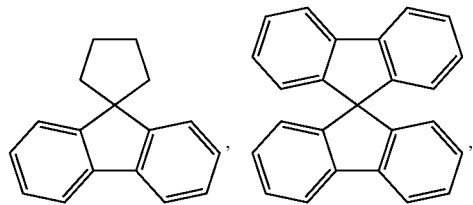

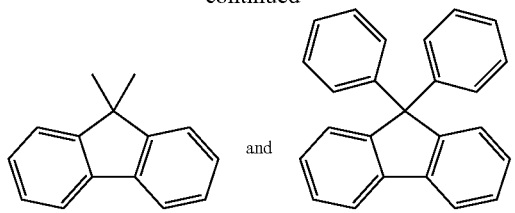 and 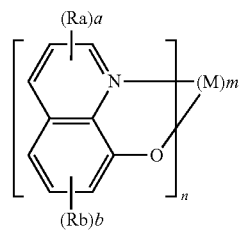.

However, the fluorenyl group is not limited thereto.

In the present specification, the heterocyclic group includes one or more of an atom other than carbon, that is, a heteroatom, and specifically, the heteroatom may include one or more atoms selected from the group consisting of O, N, Se, and S, and the like. The number of carbon atoms thereof is not particularly limited, but is preferably 2 to 60. Examples of the heterocyclic group include a thiophene group, a furan group, a pyrrole group, an imidazole group, a triazole group, an oxazole group, an oxadiazole group, a triazole group, a pyridyl group, a bipyridyl group, a pyrimidyl group, a triazine group, an acridyl group, a pyridazine group, a pyrazinyl group, a qinolinyl group, a quinazoline group, a quinoxalinyl group, a phthalazinyl group, a pyridopyrimidinyl group, a pyridopyrazinyl group, a pyrazinopyrazinyl group, an isoquinoline group, an indole group, a carbazole group, a benzoxazole group, a benzimidazole group, a benzothiazole group, a benzocarbazole group, a benzothiophene group, a dibenzothiophene group, a benzofuranyl group, a phenanthroline group, a thiazolyl group, an isoxazolyl group, an oxadiazolyl group, a thiadiazolyl group, a benzothiazolyl group, a phenothiazinyl group, a dibenzofuranyl group, and the like, but are not limited thereto.

The heterocyclic group may be monocyclic or polycyclic, and may be an aromatic ring, an aliphatic ring, or a condensed ring of the aromatic ring and the aliphatic ring.

When two or more substituents combine with each other to form a substituted or unsubstituted ring, the two or more substituents are provided while being adjacent to each other.

In the present specification, the term "adjacent" may mean a substituent substituted with an atom directly linked to an atom in which the corresponding substituent is substituted, a substituent disposed sterically closest to the corresponding substituent group, or another substituent substituted with an atom in which the corresponding substituent is substituted. For example, two substituent groups substituted at the ortho position in a benzene ring and two substituents substituted with the same carbon in an aliphatic ring may be interpreted as groups which are "adjacent" to each other.

In the present specification, examples of the ring structure, which is formed by combining the two or more substituents with each other, include an aromatic ring, an aliphatic ring, and the like, and may be monocyclic or polycyclic.

In an exemplary embodiment of the present specification, the alkali metal complex or the alkaline earth metal complex represented by Chemical Formula 1 is represented by the following Chemical Formula 1-a or 1-b.

[Chemical Formula 1-a]

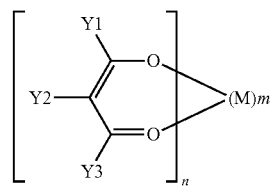

[Chemical Formula 1-b]

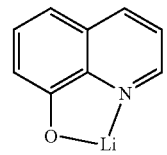

In Chemical Formulae 1-a and 1-b,
the definitions of M, m, and n are the same as those described above,
a and b are each an integer of 1 to 3,
when a and b are 2 or more, two or more structures in the parenthesis are the same as or different from each other, and
Ra, Rb, and Y1 to Y3 are the same as or different from each other, and are each independently hydrogen or a substituent, or two or more substituents combine with each other to form a substituted or unsubstituted ring.

In an exemplary embodiment of the present specification, the alkali metal complex or the alkaline earth metal complex represented by Chemical Formula 1 is represented by any one of the following Chemical Formulae 1-1 to 1-26.

Chemical Formula 1-1

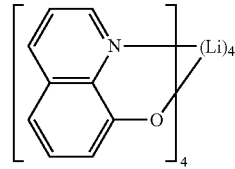

Chemical Formula 1-2

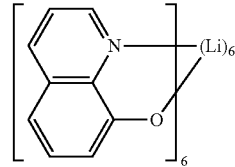

Chemical Formula 1-3

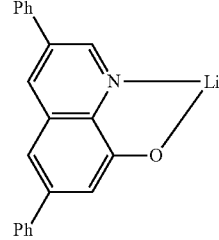

Chemical Formula 1-4

Chemical Formula 1-5
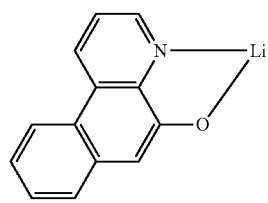
Chemical Formula 1-6
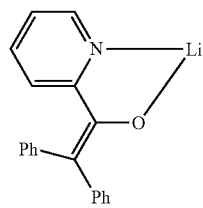
Chemical Formula 1-7
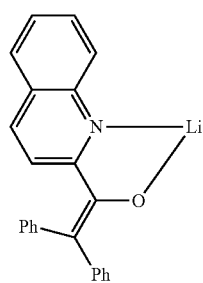
Chemical Formula 1-8
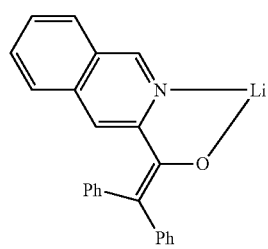
Chemical Formula 1-9
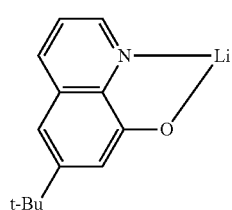
Chemical Formula 1-10
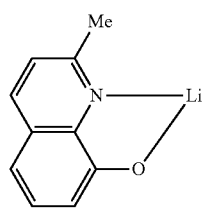
Chemical Formula 1-11
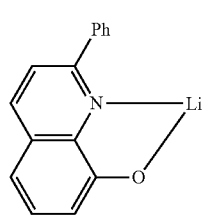
Chemical Formula 1-12
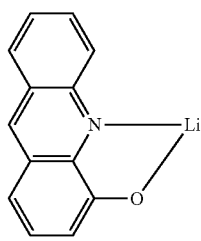
Chemical Formula 1-13
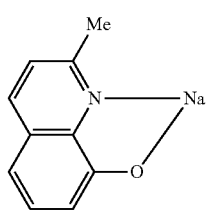
Chemical Formula 1-14
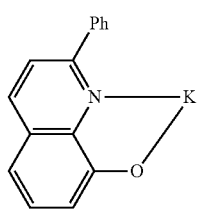
Chemical Formula 1-15
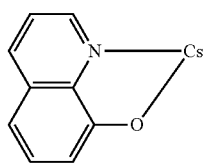
Chemical Formula 1-16
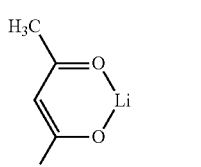
Chemical Formula 1-17
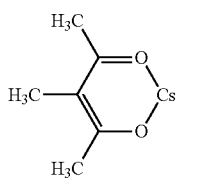
Chemical Formula 1-18
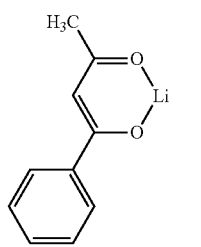

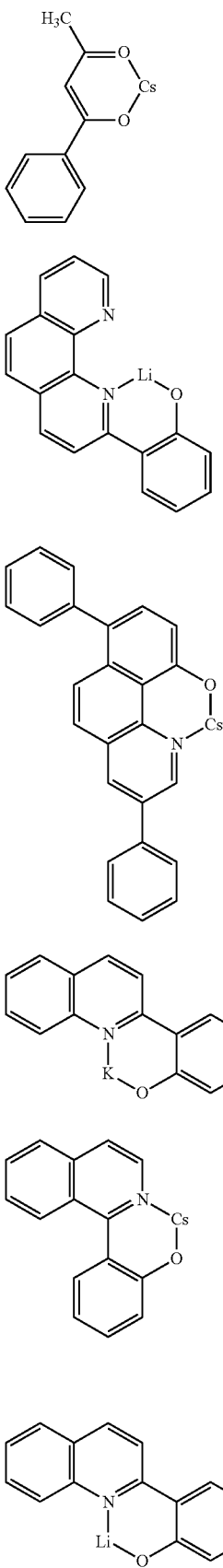

Chemical Formula 1-19

Chemical Formula 1-20

Chemical Formula 1-21

Chemical Formula 1-22

Chemical Formula 1-23

Chemical Formula 1-24

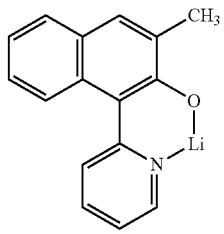

Chemical Formula 1-25

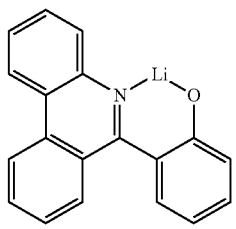

Chemical Formula 1-26

Ph means a phenyl group, Me means a methyl group, and t-Bu means a t-butyl group.

In an exemplary embodiment of the present specification, the difference between the LUMO energy level of the organic material layer adjacent to the light emitting layer among the one or more organic material layers provided between the cathode and the light emitting layer and the LUMO energy level of the light emitting layer is 1 eV or less.

Specifically, in an exemplary embodiment of the present specification, the difference between the LUMO energy level of the organic material layer adjacent to the light emitting layer among the one or more organic material layers provided between the cathode and the light emitting layer and the LUMO energy level of the light emitting layer is 0 eV or more and 1 eV or less.

When the difference between the LUMO energy level of the organic material layer adjacent to the light emitting layer among the one or more organic material layers provided between the cathode and the light emitting layer and the LUMO energy level of the light emitting layer is more than 1 eV, the movement of electrons from the cathode to the light emitting layer is stagnated to apply an excessive load on the diode, so that the diode is disadvantageous in terms of the service life. Accordingly, as in an exemplary embodiment of the present specification, when the difference between the LUMO energy level of the organic material layer adjacent to the light emitting layer among the one or more organic material layers provided between the cathode and the LUMO energy level of the light emitting layer and the light emitting layer is 1 eV or less, the movement of electrons is facilitated, so that the diode may be advantageous in terms of the efficiency of the diode.

In the present specification, the energy level means the size of energy. Accordingly, even when the energy level is expressed in the negative (−) direction from the vacuum level, it is interpreted that the energy level means an absolute value of the corresponding energy value. For example, the HOMO energy level means the distance from the vacuum level to the highest occupied molecular orbital. Further, the LUMO energy level means the distance from the vacuum level to the lowest unoccupied molecular orbital.

For the measurement of the HOMO energy level in the present specification, it is possible to use a UV photoelectron spectroscopy (UPS) for measuring the ionization potential of the material by irradiating UV on the surface of the thin film and detecting electrons jumping out in this case. Otherwise, for the measurement of the HOMO energy level, it is possible to use a cyclic voltammetry (CV) for dissolving a material to be measured along with an electrolytic solution in a solvent, and then measuring the oxidation potential through the voltage sweep. Furthermore, it is possible to use a method of photoemission yield spectrometer in air (PYSA), which measures the ionization potential in the atmosphere by using a machine of AC-3 (manufactured by RKI Instruments, Inc.).

Specifically, the HOMO energy level of the present specification was measured by vacuum depositing a target material to have a thickness of 50 nm or more on an ITO substrate, and then using an AC-3 measuring instrument (manufactured by RKI Instruments, Inc.). Further, for the LUMO energy level, the absorption spectrum (abs.) and photoluminescence spectrum (PL) of the sample prepared above were measured, and then each spectrum edge energy was calculated, the difference was taken as a bandgap (Eg), and the LUMO energy level was calculated as a value obtained by subtracting the bandgap difference from the HOMO energy level measured from the AC-3.

In the present specification, the LUMO energy level may be obtained through the measurement of inverse photoelectron spectroscopy (IPES) or electrochemical reduction potential. The IPES is a method for determining the LUMO energy level by irradiating electron beam on a thin film, and measuring light emitting in this case. In addition, for the measurement of electrochemical reduction potential, a measurement target material is dissolved along with the electrolytic solution in a solvent, and then the reduction potential may be measured through the voltage sweep. Otherwise, the LUMO energy level may be calculated by using the HOMO energy level and a singlet energy level obtained by measuring the UV absorption degree of the target material.

In an exemplary embodiment of the present specification, the light emitting layer includes a phosphorescent dopant. As described above, when a phosphorescent dopant is used, the light emitting efficiency is better than the light emitting efficiency when only a fluorescent dopant is included, but there may occur a problem in that the durability deteriorates. However, when the diode includes an organic material layer in which the dipole moment value of the compound including the heteroatom after the docking according to an exemplary embodiment of the present specification is 6 debye to 13 debye, the durability may be increased because electrons are smoothly transported. Accordingly, the organic light emitting device according to an exemplary embodiment of the present specification may provide a diode having high efficiency and a long service life.

In an exemplary embodiment of the present specification, the organic light emitting device may include two or more light emitting layers. The two or more light emitting layers may also be provided while being in contact with each other, and may also be provided while including an additional organic material layer between the two or more light emitting layers.

In an exemplary embodiment of the present specification, the organic light emitting device includes two or more light emitting layers and includes a charge generation layer between two adjacent light emitting layers in the two or more light emitting layers, and the charge generation layer may include an n-type organic material layer and a p-type organic material layer.

In another exemplary embodiment, the n-type organic material layer and the p-type organic material layer, which are included in the charge generation layer, form an NP junction.

In an exemplary embodiment of the present specification, the p-type organic material layer is selected from the group consisting of a hole injection layer, a hole transporting layer, an electron blocking layer, and a light emitting layer, and the n-type organic material layer is selected from the group consisting of an electron transporting layer, an electron injection layer, a hole blocking layer, and a light emitting layer.

In the present specification, the n-type means n-type semiconductor characteristics. In other words, the n-type is a characteristic in that electrons are injected or transported through the lowest unoccupied molecular orbital (LUMO) energy level, and this may be defined as a characteristic of a material having a mobility of electrons larger than that of holes. In contrast, the p-type means p-type semiconductor characteristics. In other words, the p-type is a characteristic in that holes are injected or transported through the highest occupied molecular orbital (HOMO) energy level, and this may be defined as a characteristic of a material having a mobility of holes larger than that of electrons. In the present specification, a compound or an organic material layer having n-type characteristics may be mentioned as an n-type compound or an n-type organic material layer. Further, a compound or organic material layer having p-type characteristics may be mentioned as a p-type compound or a p-type organic material layer. In addition, the n-type doping may mean that a doping is conducted so as to have n-type characteristics.

In the present specification, a charge generation layer is a layer of generating charges without the application of an external voltage, and generates charges between adjacent light emitting layers in two or more light emitting layers to allow the two or more light emitting layers included in the organic light emitting device to be capable of emitting light.

The NP junction in the present specification may mean not only physical contact of a second electron transporting layer, which is an n-type organic material layer, with the p-type organic material layer, but also interaction which may easily generate and transport holes and electrons.

According to an exemplary embodiment of the present specification, when an NP junction is formed, holes or electrons may be easily formed by an external voltage or light source. Accordingly, it is possible to prevent a driving voltage for injecting holes from being increased.

In another exemplary embodiment, the peak wavelengths of the photoluminescence spectra of at least two layers in the two or more light emitting layers are the same as or different from each other.

The peak wavelength in the present specification means a wavelength at the maximum value in the spectral distribution.

In an exemplary embodiment of the present specification, the peak wavelengths of the photoluminescence spectra of at least two layers in the two or more light emitting layers are different from each other.

In an exemplary embodiment of the present specification, at least one of the two or more light emitting layers includes a phosphorescent dopant, and at least one thereof includes a fluorescent dopant.

As in an exemplary embodiment of the present specification, a white light emitting diode may be manufactured by stacking blue fluorescence, green phosphorescence, and red phosphorescence; and stacking blue fluorescence and green and yellow phosphorescence, by including the two or more light emitting layers which are different from each other. Specifically, the organic light emitting device according to an exemplary embodiment of the present specification may include a fluorescent light emitting layer and/or a phosphorescent light emitting layer.

For example, in the case of blue, the peak wavelength of the photoluminescence spectrum is 400 nm to 500 nm, in the case of green, the peak wavelength of the photoluminescence spectrum is 510 nm to 580 nm, and in the case of red, the peak wavelength of the photoluminescence spectrum is 610 nm to 680 nm, and the person skilled in the art may use light emitting layers having different peak wavelengths in combination of one layer or two layers or more, if necessary.

As the phosphorescent dopant and the fluorescent dopant in the present specification, dopants commonly used in the art may be used.

In an exemplary embodiment of the present specification, the organic light emitting device includes: a first light emitting layer provided on an organic material layer including: a compound including a heteroatom; and an alkali metal complex or an alkaline earth metal complex; and a second light emitting layer provided on the first light emitting layer.

In this case, the first light emitting layer and the second light emitting layer may be provided while being brought into contact with each other, and an additional organic material layer may be provided between the first light emitting layer and the second light emitting layer.

In another exemplary embodiment of the present specification, the organic light emitting device includes: a first light emitting layer provided at a portion on an organic material layer including: a compound including a heteroatom; and an alkali metal complex or an alkaline earth metal complex; and a second light emitting layer provided at the other portion on the organic material layer including: a compound including a heteroatom; and an alkali metal complex or an alkaline earth metal complex.

In this case, the first light emitting layer and the second light emitting layer may be provided side by side on the same surface of the organic material layer including: a compound including a heteroatom; and an alkali metal complex or an alkaline earth metal complex. In one exemplary embodiment, one side surface of the first light emitting layer and one side surface of the second light emitting layer may be provided while being brought into contact with each other.

In an exemplary embodiment of the present specification, the first light emitting layer and the second light emitting layer, which are provided side by side, may be provided while being brought into contact with the same surface of the organic material layer including: a compound including a heteroatom; and an alkali metal complex or an alkaline earth metal complex.

In another exemplary embodiment, an additional layer may be provided between the first light emitting layer and the second light emitting layer, which are provided side by side, and the organic material layer including: a compound including a heteroatom; and an alkali metal complex or an alkaline earth metal complex. In an exemplary embodiment of the present specification, the additional layer may be a hole blocking layer and/or an electron transporting layer.

For example, the structure of the organic light emitting device of the present specification may have a structure as illustrated in FIGS. 1 to 3, but is not limited thereto.

FIG. 1 illustrates the structure of an organic light emitting device in which an anode (201), a hole transporting layer (301), a light emitting layer (401), an electron transporting layer (501), and a cathode (601) are sequentially stacked on a substrate (101). In FIG. 1, the electron transporting layer (501) may be the organic material layer including: a compound including a heteroatom; and an alkali metal complex or an alkaline earth metal complex.

FIG. 2 illustrates the structure of an organic light emitting device in which an anode (201), a hole transporting layer (301), a second light emitting layer (402), a first light emitting layer (403), an electron transporting layer (501), and a cathode (601) are sequentially stacked on a substrate (101). In FIG. 2, the electron transporting layer (501) may be the organic material layer including: a compound including a heteroatom; and an alkali metal complex or an alkaline earth metal complex, and the second light emitting layer (402) and the first light emitting layer (403) may be provided while being brought into contact with each other, include an additional organic material layer, and further include a third light emitting layer.

FIG. 3 illustrates the structure of an organic light emitting device in which an anode (201) and a hole transporting layer (301) are provided on a substrate (101), a second light emitting layer (402) and a first light emitting layer (403) are provided on the hole transporting layer (301), and an electron transporting layer (501) and a cathode (601) are sequentially stacked on the first light emitting layer (403) and the second light emitting layer (402). In FIG. 3, the electron transporting layer (501) may be the organic material layer including: a compound including a heteroatom; and an alkali metal complex or an alkaline earth metal complex.

FIGS. 1 to 3 illustrate an exemplified structure according to exemplary embodiments of the present specification, and may further include other organic material layers. Further, the organic material layer including: a compound including a heteroatom; and an alkali metal complex or an alkaline earth metal complex may also be a hole blocking layer instead of the electron transporting layer (501).

In an exemplary embodiment of the present specification, the organic light emitting device may further include one or more layers selected from the group consisting of a hole injection layer, a hole transporting layer, an electron transporting layer, an electron injection layer, an electron blocking layer, and a hole blocking layer.

The organic light emitting device of the present specification may be manufactured by materials and methods known in the art, except for including one or more organic material layers, which include: a compound including a heteroatom; and an alkali metal complex or an alkaline earth metal complex and are provided between the cathode and the light emitting layer.

For example, the organic light emitting device of the present specification may be manufactured by sequentially stacking an anode, an organic material layer, and a cathode on a substrate. In this case, the organic light emitting device may be manufactured by depositing a metal or a metal oxide having conductivity, or an alloy thereof on a substrate to form an anode by using a physical vapor deposition (PVD) method such as sputtering or e-beam evaporation, forming an organic material layer including a hole injection layer, a hole transporting layer, an electron blocking layer, a light emitting layer, an electron transporting layer, and an electron injection layer thereon, and then depositing a material which may be used as a cathode thereon. In addition to the method described above, an organic light emitting device may be made by subsequently depositing a cathode material, an organic material layer, and an anode material on a substrate. In addition to the method described above, an organic light emitting device may be made by subsequently depositing an anode material, an organic material layer, and a cathode material on a substrate.

The organic material layer of the organic light emitting device of the present specification may be composed of a multi-layered structure in which one or more organic material layers are stacked.

When the organic light emitting device includes a plurality of organic material layers, the organic material layer may be formed of the same material or different materials.

As the anode material, a material having a large work function is usually preferred so as to smoothly inject holes into an organic material layer. Specific examples of the anode material which may be used in the present specification include: a metal, such as vanadium, chromium, copper, zinc, and gold, or alloys thereof; a metal oxide, such as zinc oxide, indium oxide, indium tin oxide (ITO), and indium zinc oxide (IZO); a combination of metal and oxide, such as ZnO:Al or $SnO_2$:Sb; an electrically conductive polymer, such as poly(3-methylthiophene), poly[3,4-(ethylene-1,2-dioxy)thiophene] (PEDOT), polypyrrole, and polyaniline, and the like, but are not limited thereto.

As the cathode material, a material having a small work function is usually preferred so as to smoothly inject electrons into an organic material layer. Specific examples of the cathode material include: a metal, such as magnesium, calcium, sodium, potassium, titanium, indium, yttrium, lithium, gadolinium, aluminum, silver, tin, and lead, or alloys thereof; a multi-layered structural material, such as LiF/Al or $LiO_2$/Al, and the like, but are not limited thereto.

The hole injection material is a layer which injects holes from an electrode, and is preferably a compound which has a capability of transporting holes, and thus has an effect of injecting holes at an anode and an excellent effect of injecting holes for a light emitting layer or a light emitting material, prevents excitons produced from a light emitting layer from moving to an electron injection layer or an electron injection material, and is excellent in the ability to form a thin film. It is preferred that the highest occupied molecular orbital (HOMO) of the hole injection material is between the work function of the anode material and the HOMO of a peripheral organic material layer. Specific examples of the hole injection material include metal porphyrin, oligothiophene, an arylamine-based organic material, a hexanitrile hexaazatriphenylene-based organic material, a quinacridone-based organic material, a perylene-based organic material, anthraquinone, a polyaniline and polythiophene-based electrically conductive polymer, and the like, but are not limited thereto.

The hole transporting layer is a layer which receives holes from a hole injection layer and transports the holes to a light emitting layer, and a hole transporting material is a material which may receive holes from an anode or a hole injection layer to transfer the holes to a light emitting layer, and is suitably a material having large mobility for the holes. Specific examples thereof include an arylamine-based organic material, an electrically conductive polymer, a block copolymer in which a conjugate portion and a non-conjugate portion are present together, and the like, but are not limited thereto.

The light emitting material is a material which may receive holes and electrons from a hole transporting layer and an electron transporting layer, respectively, and combine the holes and the electrons to emit light in a visible ray region, and is preferably a material having good quantum efficiency to fluorescence or phosphorescence. Specific examples thereof include: a 8-hydroxy-quinoline aluminum complex ($Alq_3$); a carbazole-based compound; a dimerized styryl compound; BAlq; a 10-hydroxybenzoquinoline-metal compound; a benzoxazole, benzthiazole and benzimidazole-based compound; a poly(p-phenylenevinylene (PPV)-based polymer; a spiro compound; polyfluorene, lubrene, and the like, but are not limited thereto.

The light emitting layer may include a host material and a dopant material. Examples of the host material include a condensed aromatic ring derivative, or a hetero ring-containing compound, and the like. Specifically, examples of the condensed aromatic ring derivative include an anthracene derivative, a pyrene derivative, a naphthalene derivative, a pentacene derivative, a phenanthrene compound, a fluoranthene compound, and the like, and examples of the hetero ring-containing compound include a carbazole derivative, a dibenzofuran derivative, a ladder-type furan compound, a pyrimidine derivative, and the like, but the examples thereof are not limited thereto.

In the fluorescence light emitting layer, as the host material, one or two or more are selected from the group consisting of distyrylarylene (DSA), a distyrylarylene derivative, distyrylbenzene (DSB), a distyrylbenzene derivative, 4,4'-bis(2,2'-diphenyl vinyl)-1,1'-biphenyl (DPVBi), a DPVBi derivative, spiro-DPVBi, and spiro-6P.

In the fluorescence light emitting layer, as the dopant material, one or two or more are selected from the group consisting of styrylamine-based, pherylene-based, and distyrylbiphenyl (DSBP)-based dopant materials.

The electron injection layer is a layer which injects electrons from an electrode, and is preferably a compound which has a capability of transporting electrons, has an effect of injecting electrons from a cathode and an excellent effect of injecting electrons into a light emitting layer or a light emitting material, prevents excitons produced from the light emitting layer from moving to the hole injection layer, and is also excellent in the ability to form a thin film. Specific examples thereof include fluorenone, anthraquinodimethane, diphenoquinone, thiopyran dioxide, oxazole, oxadiazole, triazole, imidazole, perylenetetracarboxylic acid, fluorenylidene methane, anthrone and derivatives thereof, a metal complex compound, a nitrogen-containing 5-membered ring derivative, and the like, but are not limited thereto.

Examples of the metal complex compound include 8-hydroxyquinolinato lithium, bis(8-hydroxyquinolinato) zinc, bis(8-hydroxyquinolinato) copper, bis(8-hydroxyquinolinato) manganese, tris(8-hydroxyquinolinato) aluminum, tris(2-methyl-8-hydroxyquinolinato) aluminum, tris(8-hydroxyquinolinato) gallium, bis(10-hydroxybenzo[h] quinolinato) beryllium, bis(10-hydroxybenzo[h] quinolinato) zinc, bis(2-methyl-8-quinolinato) chlorogallium, bis(2-methyl-8-quinolinato) (o-cresolato) gallium, bis(2-methyl-8-quinolinato) (1-naphtholato) aluminum, bis(2-methyl-8-quinolinato) (2-naphtholato) gallium, and the like, but are not limited thereto.

The hole blocking layer is a layer which blocks holes from reaching a cathode, and may be generally formed under the same conditions as those of the hole injection layer. Specific examples thereof include an oxadiazole derivative or a triazole derivative, a phenanthroline derivative, BCP, an aluminum complex, and the like, but are not limited thereto.

The organic light emitting device according to the present specification may be a top emission type, a bottom emission type, or a dual emission type according to the material to be used.

In addition, the organic light emitting device according to the present specification may be a normal type in which a lower electrode is an anode and an upper electrode is a cathode, and may also be an inverted type in which a lower electrode is a cathode and an upper electrode is an anode.

The structure according to an exemplary embodiment of the present specification may be operated by a principle which is similar to the principle applied to an organic light emitting device, even in an organic electronic diode including an organic solar cell, an organic photoconductor, an organic transistor, and the like.

MODE FOR INVENTION

Hereinafter, the present specification will be described in detail with reference to the Examples for specifically describing the present specification. However, the Examples according to the present specification may be modified in various forms, and it is not interpreted that the scope of the present specification is limited to the Examples described below in detail. The Examples of the present specification are provided for more completely explaining the present specification to the person with ordinary skill in the art.

Experimental Examples 1-1 to 1-10

The results of calculating the dipole moments of the compounds including a heteroatom, which are represented by the following Chemical Formulae ST1 to ST9, before and after being docked to lithium quinolate (LiQ), and the result of calculating the dipole moments of the compound including a heteroatom, which is represented by the following Chemical Formula ST10, before and after being docked to lithium hydride (LiH) are shown in Table 1.

Comparative Examples 1-1 to 1-7

The results of calculating the dipole moments of the compounds including a heteroatom, which are represented by the following Chemical Formulae ET1, ET2, and ET5 to ET7, before and after being docked to lithium quinolate (LiQ), and the result of calculating the dipole moments of the compounds including a heteroatom, which are represented by the following Chemical Formulae ET3 and ET4, before and after being docked to lithium hydride (LiH) are shown in Table 1.

ST1

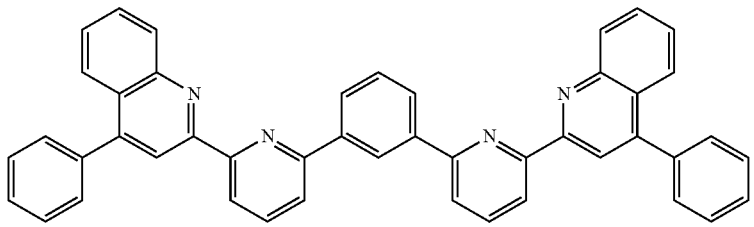

ST2

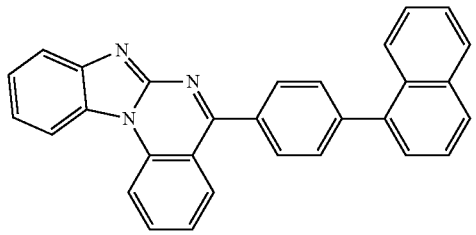

ST3

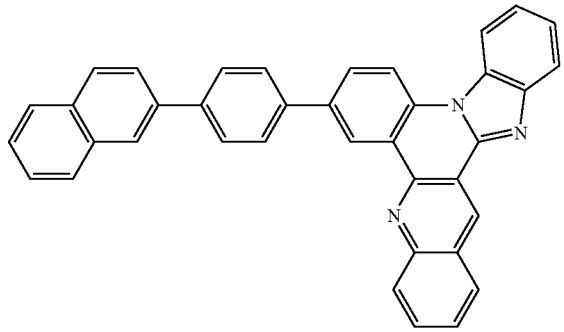

ST4

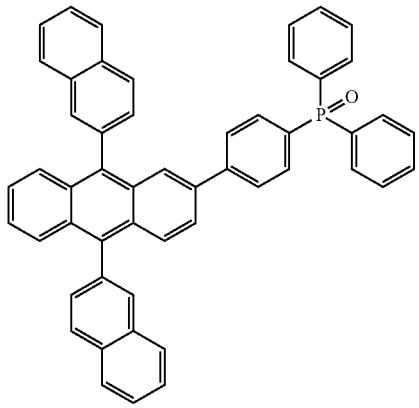

ST5

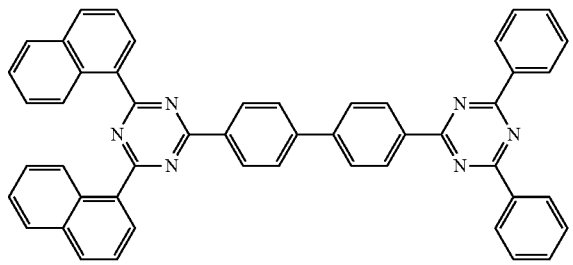

-continued
ST6
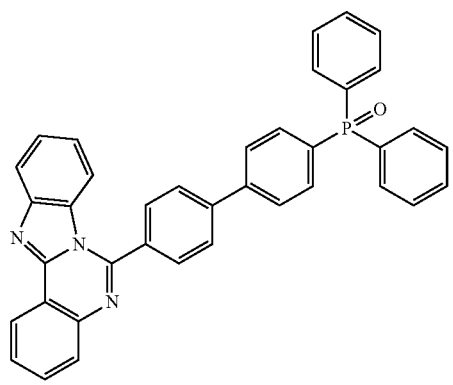
ST7
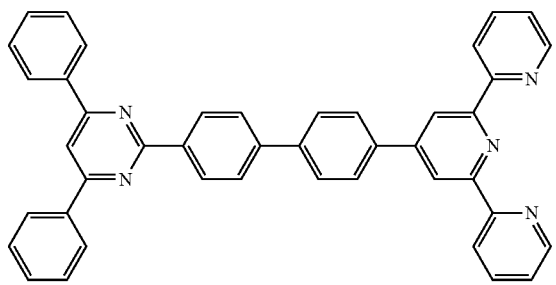
ST8
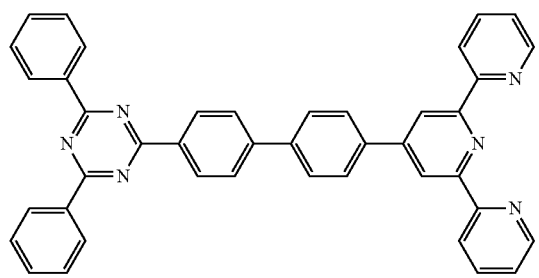
ST9
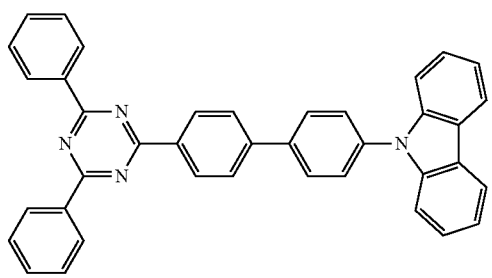
ST10
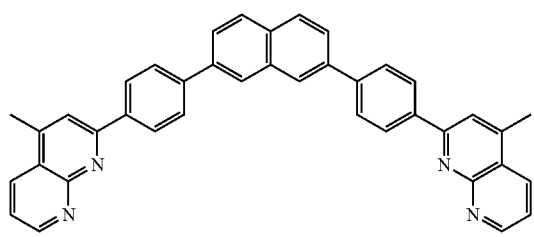
ET1
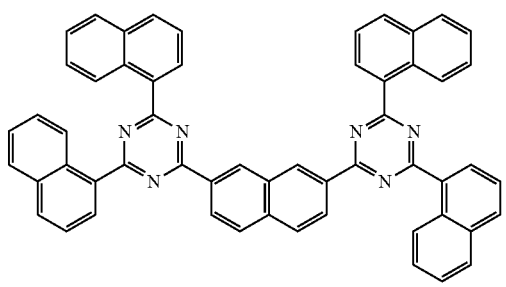
ET2
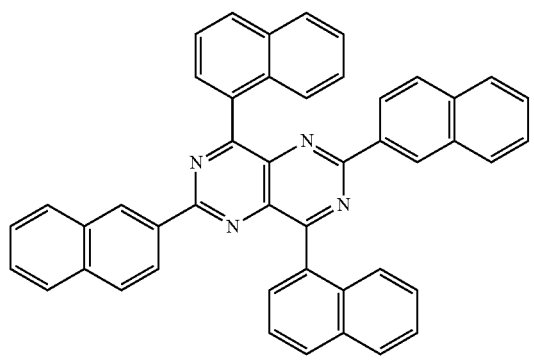
ET3
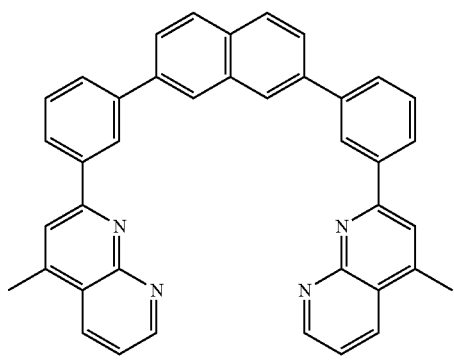

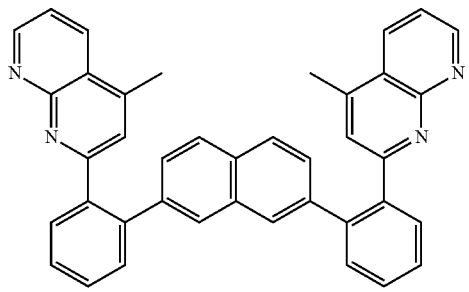

ET4

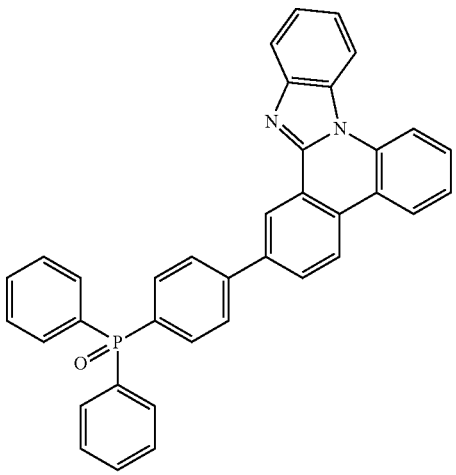

ET5

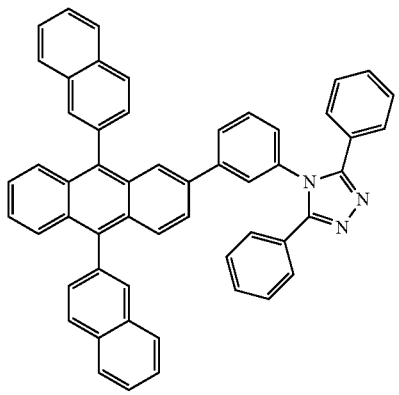

ET6

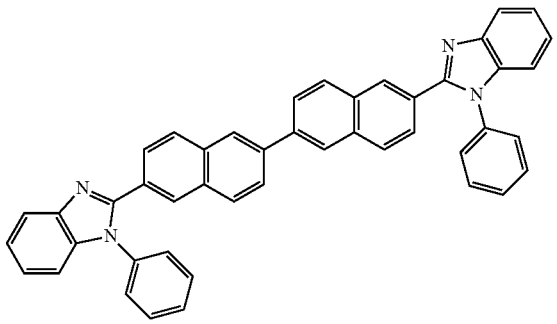

ET7

TABLE 1

| Chemical Formula | Dipole moment before docking | Dipole moment after docking | Absolute value of dipole moment before docking − dipole moment after docking |
| --- | --- | --- | --- |
| ST1 | 1.62 | 9.09 | 7.47 |
| ST2 | 4.97 | 12.07 | 7.1 |
| ST3 | 1.34 | 7.19 | 5.85 |
| ST4 | 4.1 | 11.3 | 7.2 |
| ST5 | 0.22 | 6.51 | 6.29 |
| ST6 | 3.28 | 10.35 | 7.07 |
| ST7 | 5.4 | 9.85 | 4.45 |
| ST8 | 3.7 | 7.13 | 3.43 |
| ST9 | 1.76 | 6.5 | 4.74 |
| ST10 | 3.58 | 8.81 | 5.23 |
| ET1 | 0.41 | 5.93 | 5.52 |
| ET2 | 0.16 | 4.93 | 4.77 |
| ET3 | 4.95 | 3.48 | 1.47 |
| ET4 | 4.84 | 3.6 | 1.24 |
| ET5 | 6.41 | 13.71 | 7.3 |
| ET6 | 6.66 | 8.28 | 1.62 |
| ET7 | 7.01 | 9.34 | 2.33 |

Experimental Example 2-1

A glass substrate thinly coated with indium tin oxide (ITO) to have a thickness of 500 Å was put into distilled water in which a detergent was dissolved, and ultrasonically washed. In this case, a product manufactured by the Fischer Co., was used as the detergent, and distilled water twice filtered using a filter manufactured by Millipore Co., was used as the distilled water. After the ITO was washed for 30 minutes, ultrasonic washing was conducted repeatedly twice using distilled water for 10 minutes. After the washing using distilled water was completed, ultrasonic washing was conducted using isopropyl alcohol, acetone, and methanol solvents, and drying was conducted, and then the product was transferred to a plasma cleaner. In addition, the substrate was cleaned using oxygen plasma for 5 minutes, and then transferred to a vacuum evaporator.

The following Chemical Formula [HAT] was thermally vacuum deposited to have a thickness of 50 Å on a transparent ITO electrode, which was prepared as described above, thereby forming a hole injection layer. The following Chemical Formula [NPB] was vacuum deposited to have a thickness of 1,100 Å on the hole injection layer, thereby forming a hole transporting layer. The following Chemical Formula [HT-A] was vacuum deposited to have a thickness of 200 Å on the hole transporting layer, thereby forming an electron blocking layer.

Subsequently, the following Chemical Formulae [BH] and [BD] were vacuum deposited at a weight ratio of 25:1 to have a film thickness of 350 Å on the electron blocking layer, thereby forming a light emitting layer.

The following Chemical Formula ST1 and the following Chemical Formula [LiQ] were vacuum deposited at a weight ratio of 1:1 on the light emitting layer, thereby forming an electron transporting layer having a thickness of 200 Å.

Aluminum was deposited to have a thickness of 1,000 Å on the electron transporting layer, thereby forming a cathode.

In the aforementioned procedure, the deposition rate of the organic material was maintained at 0.4 to 0.9 Å/sec, the deposition rates of lithium fluoride and aluminum of the cathode were maintained at 0.3 Å/sec and at 2 Å/sec, respectively, and the degree of vacuum during the deposition was maintained at $1\times10^{-7}$ to $5\times10^{-8}$ torr, thereby manufacturing an organic light emitting device.

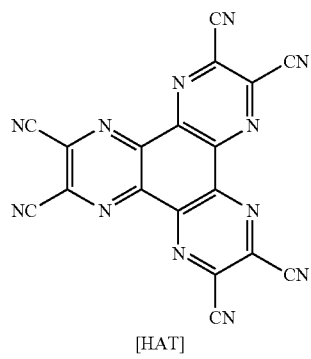

[HAT]

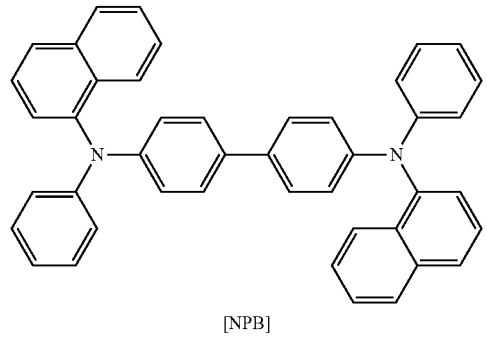

[NPB]

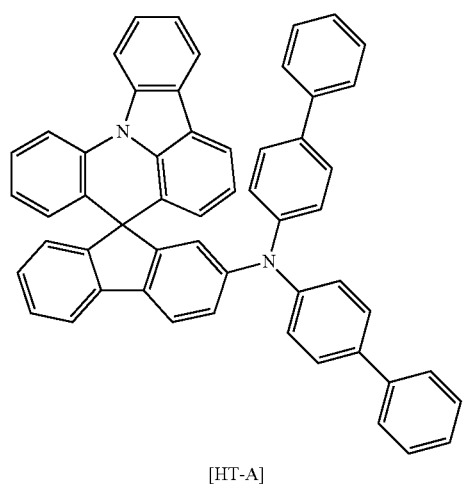

[HT-A]

-continued

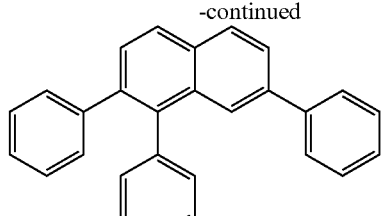

[BH]

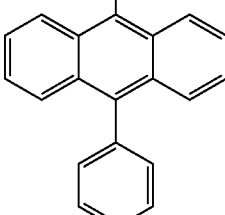

[LiQ]

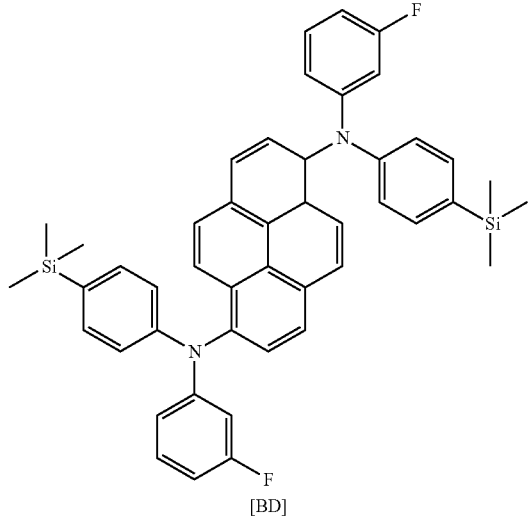

[BD]

Experimental Example 2-2

An organic light emitting device was manufactured in the same manner as in [Experimental Example 2-1], except that [ST2] was used instead of [Chemical Formula ST1] of [Experimental Example 2-1].

Experimental Example 2-3

An organic light emitting device was manufactured in the same manner as in [Experimental Example 2-1], except that [ST3] was used instead of [Chemical Formula ST1] of [Experimental Example 2-1].

Experimental Example 2-4

An organic light emitting device was manufactured in the same manner as in [Experimental Example 2-1], except that [ST4] was used instead of [Chemical Formula ST1] of [Experimental Example 2-1].

Experimental Example 2-5

An organic light emitting device was manufactured in the same manner as in [Experimental Example 2-1], except that [ST5] was used instead of [Chemical Formula ST1] of [Experimental Example 2-1].

Experimental Example 2-6

An organic light emitting device was manufactured in the same manner as in [Experimental Example 2-1], except that [ST6] was used instead of [Chemical Formula ST1] of [Experimental Example 2-1].

Experimental Example 2-7

An organic light emitting device was manufactured in the same manner as in [Experimental Example 2-1], except that [ST7] was used instead of [Chemical Formula ST1] of [Experimental Example 2-1].

Experimental Example 2-8

An organic light emitting device was manufactured in the same manner as in [Experimental Example 2-1], except that [ST8] was used instead of [Chemical Formula ST1] of [Experimental Example 2-1].

Experimental Example 2-9

An organic light emitting device was manufactured in the same manner as in [Experimental Example 2-1], except that [ST9] was used instead of [Chemical Formula ST1] of [Experimental Example 2-1].

Experimental Example 2-10

An organic light emitting device was manufactured in the same manner as in [Experimental Example 2-1], except that [ST10] was used instead of [Chemical Formula ST1] of [Experimental Example 2-1].

Comparative Example 2-1

An organic light emitting device was manufactured in the same manner as in [Experimental Example 2-1], except that [ET1] was used instead of [Chemical Formula ST1] of [Experimental Example 2-1].

Comparative Example 2-2

An organic light emitting device was manufactured in the same manner as in [Experimental Example 2-1], except that [ET2] was used instead of [Chemical Formula ST1] of [Experimental Example 2-1].

Comparative Example 2-3

An organic light emitting device was manufactured in the same manner as in [Experimental Example 2-1], except that [ET3] was used instead of [Chemical Formula ST1] of [Experimental Example 2-1].

Comparative Example 2-4

An organic light emitting device was manufactured in the same manner as in [Experimental Example 2-1], except that [ET4] was used instead of [Chemical Formula ST1] of [Experimental Example 2-1].

Comparative Example 2-5

An organic light emitting device was manufactured in the same manner as in [Experimental Example 2-1], except that [ET5] was used instead of [Chemical Formula ST1] of [Experimental Example 2-1].

Comparative Example 2-6

An organic light emitting device was manufactured in the same manner as in [Experimental Example 2-1], except that [ET6] was used instead of [Chemical Formula ST1] of [Experimental Example 2-1].

Comparative Example 2-7

An organic light emitting device was manufactured in the same manner as in [Experimental Example 2-1], except that [ET7] was used instead of [Chemical Formula ST1] of [Experimental Example 2-1].

For the organic light emitting devices manufactured by the above-described method, the driving voltage and the light emitting efficiency were measured at a current density of 10 mA/cm$^2$, and a time T90 for reaching a 90% value compared to the initial luminance was measured at a current density of 20 mA/cm$^2$. The results are shown in the following Table 2.

TABLE 2

| | Voltage (V) | Efficiency (Cd/A) | Color coordinate (x, y) | Service life (h) $T_{90}$ at 20 mA/cm$^2$ |
|---|---|---|---|---|
| Experimental Example 2-1 | 4.32 | 6.42 | (0.138, 0.112) | 157 |
| Experimental Example 2-2 | 3.92 | 6.95 | (0.138, 0.111) | 170 |
| Experimental Example 2-3 | 4.06 | 6.71 | (0.138, 0.112) | 152 |
| Experimental Example 2-4 | 4.05 | 6.75 | (0.138, 0.110) | 152 |
| Experimental Example 2-5 | 4.22 | 6.53 | (0.138, 0.110) | 192 |
| Experimental Example 2-6 | 4.38 | 6.53 | (0.138, 0.112) | 157 |
| Experimental Example 2-7 | 4.05 | 6.75 | (0.138, 0.110) | 187 |
| Experimental Example 2-8 | 4.51 | 6.22 | (0.138, 0.112) | 171 |
| Experimental Example 2-9 | 4.38 | 6.53 | (0.138, 0.113) | 181 |
| Experimental Example 2-10 | 4.32 | 6.42 | (0.138, 0.112) | 157 |
| Comparative Example 2-1 | 5.1 | 4.42 | (0.138, 0.114) | 92 |
| Comparative Example 2-2 | 5.12 | 4.32 | (0.138, 0.115) | 53 |

TABLE 2-continued

| | Voltage (V) | Efficiency (Cd/A) | Color coordinate (x, y) | Service life (h) $T_{90}$ at 20 mA/cm² |
|---|---|---|---|---|
| Comparative Example 2-3 | 4.75 | 5.32 | (0.138, 0.115) | 112 |
| Comparative Example 2-4 | 4.88 | 5.29 | (0.138, 0.114) | 132 |
| Comparative Example 2-5 | 5.22 | 5.3 | (0.137, 0.113) | 93 |
| Comparative Example 2-6 | 4.68 | 5.91 | (0.136, 0.111) | 149 |
| Comparative Example 2-7 | 4.66 | 5.89 | (0.137, 0.114) | 144 |

From the observation of the results in Table 2, it can be confirmed that the organic light emitting device, which includes an organic material layer in which a compound including a heteroatom after the docking has a dipole moment of 6 debye to 13 debye, has a lower driving voltage and higher efficiency than the organic light emitting device, which includes an organic material layer in which the compound including a heteroatom after the docking has a dipole moment of less than 6 debye or more than 13 debye.

Experimental Example 3-1

A glass substrate thinly coated with indium tin oxide (ITO) to have a thickness of 1,500 Å was put into distilled water in which a detergent was dissolved, and ultrasonically washed. In this case, a product manufactured by the Fischer Co., was used as the detergent, and distilled water twice filtered using a filter manufactured by Millipore Co., was used as the distilled water. After the ITO was washed for 30 minutes, ultrasonic washing was conducted repeatedly twice using distilled water for 10 minutes. After the washing using distilled water was completed, ultrasonic washing was conducted using isopropyl alcohol, acetone, and methanol solvents, and drying was conducted, and then the product was transferred to a plasma cleaner. In addition, the substrate was cleaned using oxygen plasma for 5 minutes, and then transferred to a vacuum evaporator.

Chemical Formula [HAT] was thermally vacuum deposited to have a thickness of 500 Å on a transparent ITO electrode, which was prepared as described above, thereby forming a hole injection layer.

The [NPB] compound having the structure was thermally vacuum deposited to a thickness of 400 Å on the hole injection layer, thereby forming a hole transporting layer. Subsequently, a compound of the following Chemical Formula [H1] was vacuum deposited to have a film thickness of 300 Å at a concentration of 10% with respect to an Ir(ppy)₃ dopant on the hole transporting layer, thereby forming a light emitting layer.

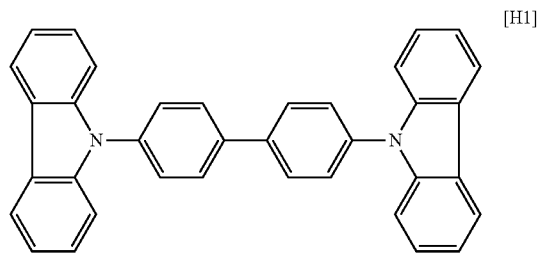 [SMILES: c1ccc2c(c1)c1ccccc1n2-c1ccc(-c2ccc(-n3c4ccccc4c4ccccc43)cc2)cc1]

[H1]

An electron transporting material as described below was vacuum deposited to have a thickness of 200 Å on the light emitting layer, thereby forming a layer which injects and transports electrons.

Chemical Formula ST1 and Chemical Formula [LiQ] were vacuum deposited at a weight ratio of 1:1 on the light emitting layer, thereby forming an electron transporting layer having a thickness of 200 Å. Aluminum was deposited to have a thickness of 1,000 Å on the electron transporting layer, thereby forming a cathode.

In the aforementioned procedure, the deposition rate of the organic material was maintained at 0.4 to 0.7 Å/sec, the deposition rates of lithium fluoride and aluminum of the cathode were maintained at 0.3 Å/sec and at 2 Å/sec, respectively, and the degree of vacuum during the deposition was maintained at $2 \times 10^{-7}$ to $5 \times 10^{-8}$ torr, thereby manufacturing an organic light emitting device.

Experimental Example 3-2

An organic light emitting device was manufactured in the same manner as in [Experimental Example 3-1], except that [ST2] was used instead of [Chemical Formula ST1] of [Experimental Example 3-1].

Experimental Example 3-3

An organic light emitting device was manufactured in the same manner as in [Experimental Example 3-1], except that [ST3] was used instead of [Chemical Formula ST1] of [Experimental Example 3-1].

Experimental Example 3-4

An organic light emitting device was manufactured in the same manner as in [Experimental Example 3-1], except that [ST4] was used instead of [Chemical Formula ST1] of [Experimental Example 3-1].

Experimental Example 3-5

An organic light emitting device was manufactured in the same manner as in [Experimental Example 3-1], except that [ST5] was used instead of [Chemical Formula ST1] of [Experimental Example 3-1].

Experimental Example 3-6

An organic light emitting device was manufactured in the same manner as in [Experimental Example 3-1], except that [ST6] was used instead of [Chemical Formula ST1] of [Experimental Example 3-1].

Experimental Example 3-7

An organic light emitting device was manufactured in the same manner as in [Experimental Example 3-1], except that [ST7] was used instead of [Chemical Formula ST1] of [Experimental Example 3-1].

Experimental Example 3-8

An organic light emitting device was manufactured in the same manner as in [Experimental Example 3-1], except that [ST8] was used instead of [Chemical Formula ST1] of [Experimental Example 3-1].

Experimental Example 3-9

An organic light emitting device was manufactured in the same manner as in [Experimental Example 3-1], except that [ST9] was used instead of [Chemical Formula ST1] of [Experimental Example 3-1].

Experimental Example 3-10

An organic light emitting device was manufactured in the same manner as in [Experimental Example 3-1], except that [ST10] was used instead of [Chemical Formula ST1] of [Experimental Example 3-1].

Comparative Example 3-1

An organic light emitting device was manufactured in the same manner as in [Experimental Example 3-1], except that [ET1] was used instead of [Chemical Formula ST1] of [Experimental Example 3-1].

Comparative Example 3-2

An organic light emitting device was manufactured in the same manner as in [Experimental Example 3-1], except that [ET2] was used instead of [Chemical Formula ST1] of [Experimental Example 3-1].

Comparative Example 3-3

An organic light emitting device was manufactured in the same manner as in [Experimental Example 3-1], except that [ET3] was used instead of [Chemical Formula ST1] of [Experimental Example 3-1].

Comparative Example 3-4

An organic light emitting device was manufactured in the same manner as in [Experimental Example 3-1], except that [ET4] was used instead of [Chemical Formula ST1] of [Experimental Example 3-1].

Comparative Example 3-5

An organic light emitting device was manufactured in the same manner as in [Experimental Example 3-1], except that [ET5] was used instead of [Chemical Formula ST1] of [Experimental Example 3-1].

Comparative Example 3-6

An organic light emitting device was manufactured in the same manner as in [Experimental Example 3-1], except that [ET6] was used instead of [Chemical Formula ST1] of [Experimental Example 3-1].

Comparative Example 3-7

An organic light emitting device was manufactured in the same manner as in [Experimental Example 3-1], except that [ET7] was used instead of [Chemical Formula ST1] of [Experimental Example 3-1].

For the organic light emitting devices manufactured by the above-described method, the driving voltage and the light emitting efficiency were measured at a current density of 10 mA/cm$^2$. The results are shown in the following Table 3.

TABLE 3

| | Voltage (V) | Efficiency (Cd/A) | Color coordinate (x, y) |
|---|---|---|---|
| Experimental Example 3-1 | 3.43 | 43.72 | (0.368, 0.632) |
| Experimental Example 3-2 | 3.32 | 42.95 | (0.368, 0.610) |
| Experimental Example 3-3 | 3.53 | 41.15 | (0.365, 0.619) |
| Experimental Example 3-4 | 3.41 | 45.15 | (0.365, 0.621) |
| Experimental Example 3-5 | 3.82 | 46.8 | (0.368, 0.612) |
| Experimental Example 3-6 | 3.54 | 44.5 | (0.378, 0.617) |
| Experimental Example 3-7 | 3.77 | 41.2 | (0.372, 0.623) |
| Experimental Example 3-8 | 3.72 | 45.9 | (0.378, 0.613) |
| Experimental Example 3-9 | 3.86 | 43.3 | (0.368, 0.622) |
| Experimental Example 3-10 | 3.68 | 46.5 | (0.378, 0.611) |
| Comparative Example 3-1 | 4.64 | 38.9 | (0.369, 0.611) |
| Comparative Example 3-2 | 4.59 | 35.15 | (0.366, 0.601) |
| Comparative Example 3-3 | 4.76 | 36.27 | (0.368, 0.626) |
| Comparative Example 3-4 | 4.81 | 36.25 | (0.366, 0.613) |
| Comparative Example 3-5 | 4.86 | 36.27 | (0.365, 0.618) |
| Comparative Example 3-6 | 4.07 | 40.22 | (0.364, 0.611) |
| Comparative Example 3-7 | 4.1 | 41.35 | (0.365, 0.618) |

From the observation of the results in Table 3, it can be confirmed that the organic light emitting device, which includes an organic material layer in which a compound including a heteroatom after the docking has a dipole moment of 6 debye to 13 debye, has a lower driving voltage and higher efficiency than the organic light emitting device, which includes an organic material layer in which the compound including a heteroatom after the docking has a dipole moment of less than 6 debye or more than 13 debye.

The invention claimed is:

1. An organic light emitting device comprising:
a cathode;
an anode;
a light emitting layer provided between the cathode and the anode; and
at least one organic material layer provided between the cathode and the light emitting layer,
wherein the at least one organic material layer provided between the cathode and the light emitting layer comprises: a compound including a heteroatom; and an alkali metal complex or an alkaline earth metal complex, and
at least one of the heteroatoms of the compound including a heteroatom is docked with the alkali metal complex or the alkaline earth metal complex,
the compound comprising the heteroatom before the docking has a dipole moment of less than 6 debye,
the compound comprising the heteroatom after the docking has a dipole moment of 6 debye to 13 debye,
wherein the compound comprising a heteroatom comprises any one of the following structures:

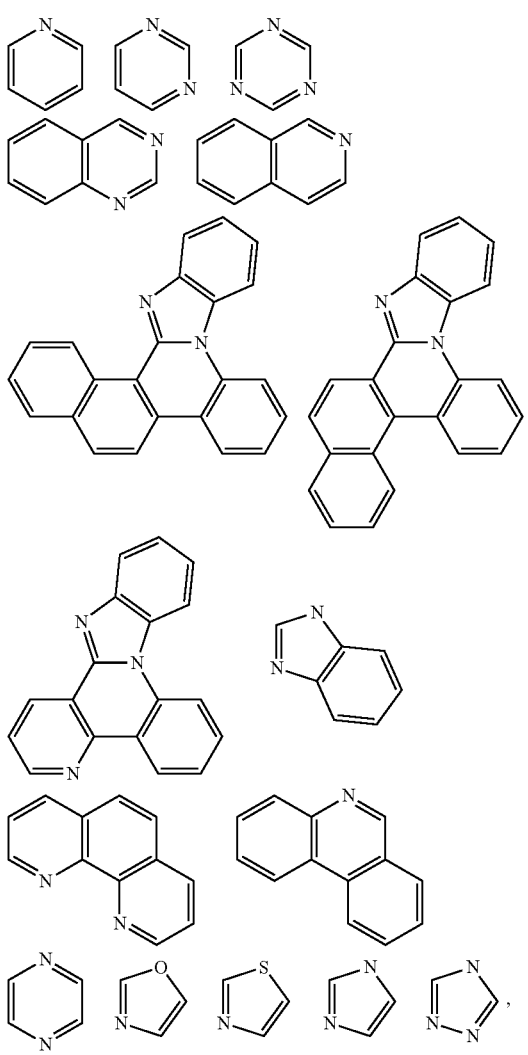

each of which are unsubstituted or substituted with one or more substituent groups selected from the group consisting of deuterium, an alkyl group, an aryl group, and a heterocyclic group, wherein the substituent group may be further substituted with one or more selected from the group consisting of an alkyl group, a cycloalkyl group, an aryl group, and a heterocyclic group, and wherein the substituent group may have two or more groups linked to each other, and wherein the alkali metal complex or the alkaline earth metal complex is represented by the following Chemical Formula 1:

[Chemical Formula 1]

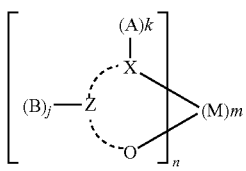

wherein in Chemical Formula 1,

Z and a dashed arc represent two or three atoms and bonds essentially required to complete a 5- or 6-membered ring together with M;

each A independently represents hydrogen or a substituent, each B is an independently selected substituent on a Z atom, or two or more B's combine with each other to form a substituted or unsubstituted ring, j is 0 to 3, k is 1 or 2, M is an alkali metal or an alkaline earth metal, X is N or O, and m and n are an integer independently selected so as to provide a neutral charge on the alkali metal complex or the alkaline metal complex, with the proviso that the compound comprising a heteroatom does not include a P=O group.

2. The organic light emitting device of claim 1, wherein the light emitting layer comprises a phosphorescent dopant.

3. The organic light emitting device of claim 1, wherein the at least one organic material layer is selected from the group consisting of an electron injection layer, an electron transporting layer, and a hole blocking layer.

4. The organic light emitting device of claim 1, wherein a difference between a dipole moment value of the compound comprising the heteroatom after the docking and a dipole moment value of the compound comprising the heteroatom before the docking is 3 debye to 8 debye.

5. The organic light emitting device of claim 1, wherein the at least one organic material layer comprises the compound including a heteroatom and the alkali metal complex or the alkaline earth metal complex at a weight ratio of 1:9 to 9:1.

6. The organic light emitting device of claim 1, wherein the organic light emitting device comprises two or more light emitting layers.

7. The organic light emitting device of claim 6, wherein peak wavelengths of the photoluminescence spectra of at least two layers in the two or more light emitting layers are different from each other.

8. The organic light emitting device of claim 6, wherein at least one of the two or more light emitting layers comprises a phosphorescent dopant, and at least one thereof comprises a fluorescent dopant.

9. The organic light emitting device of claim 1, wherein the organic light emitting device comprises: a first light emitting layer provided on the at least one organic material layer and a second light emitting layer provided on the first light emitting layer.

10. The organic light emitting device of claim 1, wherein the organic light emitting device comprises:

a first light emitting layer provided at on a portion of Off the at least one organic material layer, and a second light emitting layer provided on another portion of the at least one organic material layer.

11. The organic light emitting device of claim 1, further comprising: at least one layer selected from the group consisting of a hole injection layer, a hole transporting layer, an electron transporting layer, an electron injection layer, an electron blocking layer, and a hole blocking layer.

* * * * *